United States Patent [19]
Knierim

[11] Patent Number: 6,076,922
[45] Date of Patent: Jun. 20, 2000

[54] METHOD AND APPARATUS FOR GENERATING A DOT CLOCK SIGNAL FOR CONTROLLING OPERATION OF A PRINT HEAD

[75] Inventor: David L. Knierim, Wilsonville, Oreg.

[73] Assignee: Tektronics, Inc., Wilsonville, Oreg.

[21] Appl. No.: 08/993,253

[22] Filed: Dec. 18, 1997

[51] Int. Cl.$^7$ ........................................................ B41J 2/14
[52] U.S. Cl. ................................................. 347/103; 347/43
[58] Field of Search .............................. 347/103, 40, 101, 347/14, 16, 37

[56] References Cited

U.S. PATENT DOCUMENTS

| | | | |
|---|---|---|---|
| 4,833,375 | 5/1989 | Del Signore, II | 347/37 |
| 5,381,170 | 1/1995 | Mutoh | 347/16 |
| 5,446,358 | 8/1995 | Nakata | 347/37 |
| 5,600,352 | 2/1997 | Knierim et al. | 347/40 |
| 5,659,587 | 8/1997 | Knierim | 375/376 |

*Primary Examiner*—John Barlow
*Assistant Examiner*—Charles W. Stewart, Jr.
*Attorney, Agent, or Firm*—John Smith-Hill; Francis I. Gray; Ralph D'Alessandro

[57] ABSTRACT

An ink jet printer includes an image transfer drum and a print head for ejecting drops of ink toward the image transfer drum as the drum rotates relative to the print head undergo. A control mechanism controls operation of the print head relative to rotation of the drum in response to a dot clock signal. The control mechanism includes a position encoder which generates an encoder signal at a frequency dependent on rotation of the image transfer drum and a digital phase locked loop circuit which receives the encoder signal and generates the dot clock signal at a frequency equal to the frequency of the encoder signal multiplied by a rational number.

12 Claims, 4 Drawing Sheets

METHOD AND APPARATUS FOR GENERATING A DOT CLOCK SIGNAL FOR CONTROLLING OPERATION OF A PRINT HEAD

BACKGROUND OF THE INVENTION

This invention relates to a method and apparatus for generating a dot clock signal for controlling operation of a print head.

In a known type of image transfer ink jet printer, an image receiving drum rotates relative to an ink jet array print head which spans at least a segment of the length of the drum. The drum is driven to rotate about its central axis, so that the print head scans the peripheral surface of the drum. (In the following description, the X-axis is parallel to the axis of rotation of the drum whereas the Y-axis is tangential to the drum and displacement along the Y-axis is measured about the periphery of the drum. References to units of linear displacement relate to linear displacement about the periphery of the drum.) The angular position of the drum is measured by use of a Y-axis position encoder which generates a pulse-form encoder signal at a spatial frequency of 150 cycles per inch (about 59.1 cycles per cm) of peripheral movement of the drum. As the drum rotates, the print head fires and ink drops are ejected toward the drum and are deposited on the transfer drum at a peripheral position that depends on the timing of the firing of the print head relative to the angle of rotation of the drum from a datum position which may be considered to be the top of the image being formed on the transfer drum. When the image has been deposited on the drum, a transfer roller is moved into contact with the transfer drum. A sheet of print medium, such as paper or transparency film, is fed through the nip between the transfer drum and the transfer roller, and the image is transferred from the transfer drum to the print medium.

For full color printing, the ink jet array print head includes an array of yellow jets spaced apart in the X direction and similar arrays of cyan, magenta and black jets. The arrays are spaced apart in the Y direction, so that as the drum rotates, the peripheral surface of the drum is scanned sequentially by the yellow, cyan, magenta and black arrays.

If two adjacent arrays of jets, e.g. the array of cyan jets and the array of magenta jets, are spaced apart in the Y direction by a distance $D_{min}$ and the other pairs of adjacent arrays of jets are spaced apart in the Y direction by an integer multiple of $D_{min}$, the printer will be able to address an integer number of pixels (separately addressable areas on the surface of the transfer drum) in the Y direction between each array of jets if it is able to resolve a displacement $D_{min}$ in the Y direction into an integer number of pixels.

Firing of the print head is controlled by a dot clock signal. If the distance $D_{min}$ is 11/300 inch (about .931 mm), a displacement $D_{min}$ in the Y direction can be resolved into 11 pixels, achieving a vertical resolution of 300 dpi (about 118 dots per cm), by a dot clock signal having a frequency of 300 cycles per inch (about 118 cycles per cm).

A dot clock signal having a frequency of 300 inch$^{-1}$ can be generated from an encoder signal having a frequency of 150 inch$^{-1}$ by detecting both rising and falling edges of the encoder signal. A dot clock signal having a frequency of 600 inch$^{-1}$, which permits a resolution of 600 dpi to be achieved, can be generated by detecting the rising and falling edges of a signal having a frequency of 300 inch$^{-1}$.

An encoder signal having a frequency of 218 cycles per inch (about 85.8 cycles per cm) could be used to generate a dot clock signal of 436 inch$^{-1}$ (about 172 cm$^{-1}$) by detecting both rising and falling edges of the encoder signal. With a print head of the structure described above and having a distance $D_{min}$ equal to 11/300 inch, a dot clock signal at 436 inch$^{-1}$ corresponds almost exactly to 16 pixels between arrays. The signal at 436 inch$^{-1}$ could be used to generate a dot clock signal of 872 inch$^{-1}$ (about 343 cm$^{-1}$), corresponding almost exactly to 32 pixels between arrays.

There are disadvantages to the technique of detecting both rising and falling edges of the encoder signal (or a derivative of the encoder signal) for generating a dot clock signal at a higher frequency.

Further, it would be desirable to have greater flexibility in selecting the vertical resolution with which an image can be printed using an image transfer ink jet printer without its being necessary to employ a different Y-axis position encoder and without limitation to integer multiples of the spatial frequency of the output signal of the Y-axis position encoder.

SUMMARY OF THE INVENTION

According to a first aspect of the present invention there is provided a printer including a print support member, a print head for ejecting drops of ink toward the print support member as the print support member and the print head undergo relative movement, and a control mechanism for controlling operation of the print head as a function of relative movement of the print head and print support member, said control mechanism including a position encoder for generating an encoder signal at a frequency dependent on relative movement of the print head and print support member, and a digital phase locked loop circuit which receives the encoder signal and generates a dot clock signal at a frequency equal to the frequency of the encoder signal multiplied by a rational number.

According to a second aspect of the present invention there is provided an ink jet printer including a print support member and a print head for ejecting ink drops toward the print support member as the print head and the print support member undergo relative movement in accordance with a pattern composed of scan lines parallel to a first axis and spaced apart along a second axis, wherein the print head is positionable in a first range of relative positions along the second axis for ejecting ink drops toward a first segment of the print support member and is displaceable along the second axis from the first range of relative positions to a second range of relative positions for ejecting ink drops toward a second segment of the print support member, a position encoder for generating an encoder pulse signal dependent on relative movement of the print head and the print support member along said first axis, and a digital phase locked loop circuit which comprises a phase comparator for receiving the encoder pulse signal and a feedback signal and generating a phase difference signal having at least first and second states, an integrator which outputs a digital signal representative of the integral with respect to time of the phase difference signal, a pulse generator responsive to said digital signal for generating a pulse output signal having a period dependent on said integral, and an output circuit for receiving the pulse output signal of the pulse generator and providing a first output signal and a second output signal, wherein the first output signal is the feedback signal and the second output signal is the dot clock signal, and wherein the output circuit includes a frequency dividing counter for dividing the frequency of the pulse output signal by a selected constant to generate the second output signal, the frequency dividing counter being resettable to a selected start value after relative displacement of the print head from the first range of relative positions to the second range of relative positions, whereby phase displacement between the output of the pulse generator and the output signal of the output divider can be adjusted to compensate for change in position of the print head along the first axis on relative displacement of the print head from the first range of positions to the second range of positions.

According to a third aspect of the present invention there is provided a phase locked loop circuit comprising a phase comparator for receiving a reference pulse signal and a feedback signal respectively and generating a phase difference signal having at least first and second states, an up/down counter for incrementing a count value in the event the phase difference signal has the first state and decrementing the count value in the event the phase difference signal has the second state and outputting a count value signal representative of the count value, and a variable period pulse generator responsive to the count value signal for generating a pulse output signal having a period dependent on said count value, the pulse generator including a digital differential analyzer which provides an output signal at a frequency depending on a relationship between the count value and a constant, and wherein the output of the pulse generator is operatively coupled to the feedback input of the phase comparator.

According to a fourth aspect of the present invention there is provided a phase locked loop circuit comprising a phase comparator for receiving a reference pulse signal and a feedback signal and generating a phase difference signal having at least first and second states, a counter for incrementing a count value in the event the phase difference signal has the first state and decrementing the count value in the event the phase difference signal has the second state and outputting a count value signal representative of the count value, a variable period pulse generator responsive to the count value signal for generating an output pulse signal having a period dependent on said count value, the output of the pulse generator being operatively coupled to the feedback input of the phase comparator, and an output divider for receiving the pulse output signal of the pulse generator and providing an output signal, the output divider being resettable whereby the phase displacement between the output of the pulse generator and the output signal of the output divider can be adjusted.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
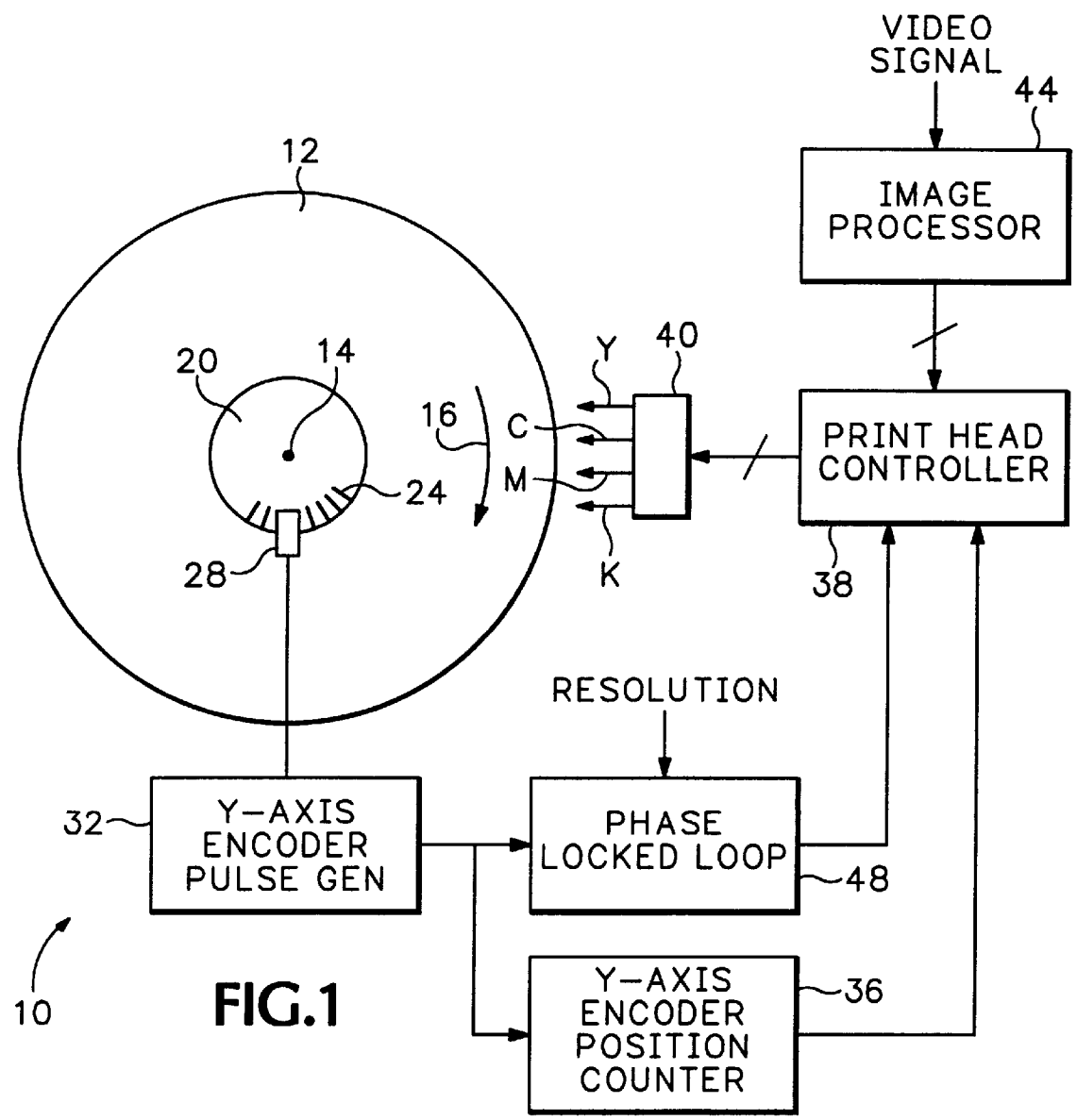
FIG. 1 is a partial schematic side view of a first ink jet printer in accordance with the present invention.

FIG. 1 illustrates an image transfer ink jet printer 10 including a transfer drum 12 which has a circumference of 12.5 inches (about 31.75 cm). The transfer drum is supported in a frame (not shown) by bearings and is driven by a motor (not shown) to rotate relative to the frame about an axis of rotation 14 in the direction indicated by the arrow 16.

The printer 10 also includes an ink jet array print head 40 which is mounted in the printer frame in a manner which allows translation of the print head in the X direction but prevents movement of the print head perpendicular to the X-axis. The print head 40 has an array of yellow jets spaced apart in the X direction and similar arrays of cyan, magenta and black jets. When the drum 12 rotates in the direction of the arrow 16, the peripheral surface of the drum is scanned sequentially by the yellow, cyan, magenta and black arrays.

The array of cyan jets is spaced from the array of magenta jets in the Y direction by 11/300 inch whereas it is spaced from the array of yellow jets by 22/300 inch. The arrays of magenta and black jets are spaced by 22/300 inch.

An image processor 44 receives a video signal representing the image that is to be deposited on the transfer drum and generates an image file defining, for each pixel of the image area on the drum's surface, the color(s), if any, of ink to be applied to that pixel.

A Y-axis encoder disk 20 is attached to the drum 12 and rotates therewith. The encoder disk 20 is provided with indicia 24 which can be detected using a detector 28. The output signal of the detector 28 is processed by a Y-axis encoder pulse generator 32 to provide a pulse-form encoder signal having a frequency of 1875 cycles per revolution of the drum, which corresponds to 150 cycles per inch.

The encoder signal is supplied to a Y-axis position counter 36 which counts the pulses of the encoder signal. The Y-axis position counter counts down from 1874. When the count reaches zero, the counter is reset to 1874 and issues a start signal. Each time the counter 36 issues the start signal, the drum is in the same angular position relative to the print head 40. In this manner, the counter 36 keeps track of the angular position of the drum.

The counter 36 supplies the start signal to a print head controller, which also receives the image file from the image processor. The print head controller 38 supplies drive signals to the print head 40 to cause each jet to fire at the proper times to deposit the desired image on the drum 12.

The encoder signal generated by the Y-axis encoder pulse generator 32 is also supplied to a phase locked loop 48.

The topology of the conventional analog phase locked loop is well known. The analog phase locked loop comprises a phase detector which receives a reference signal and a feedback signal and generates a phase difference signal depending on the phase relationship of the reference and feedback signals. The phase difference signal is supplied to an integrator, whose output is connected to the control input of a voltage controlled oscillator (VCO). The output signal of the VCO is supplied, generally through a frequency divider, to the phase detector as the feedback signal. When the analog phase locked loop is properly adjusted, the feedback signal is forced into phase with the reference signal.

Figure 2:
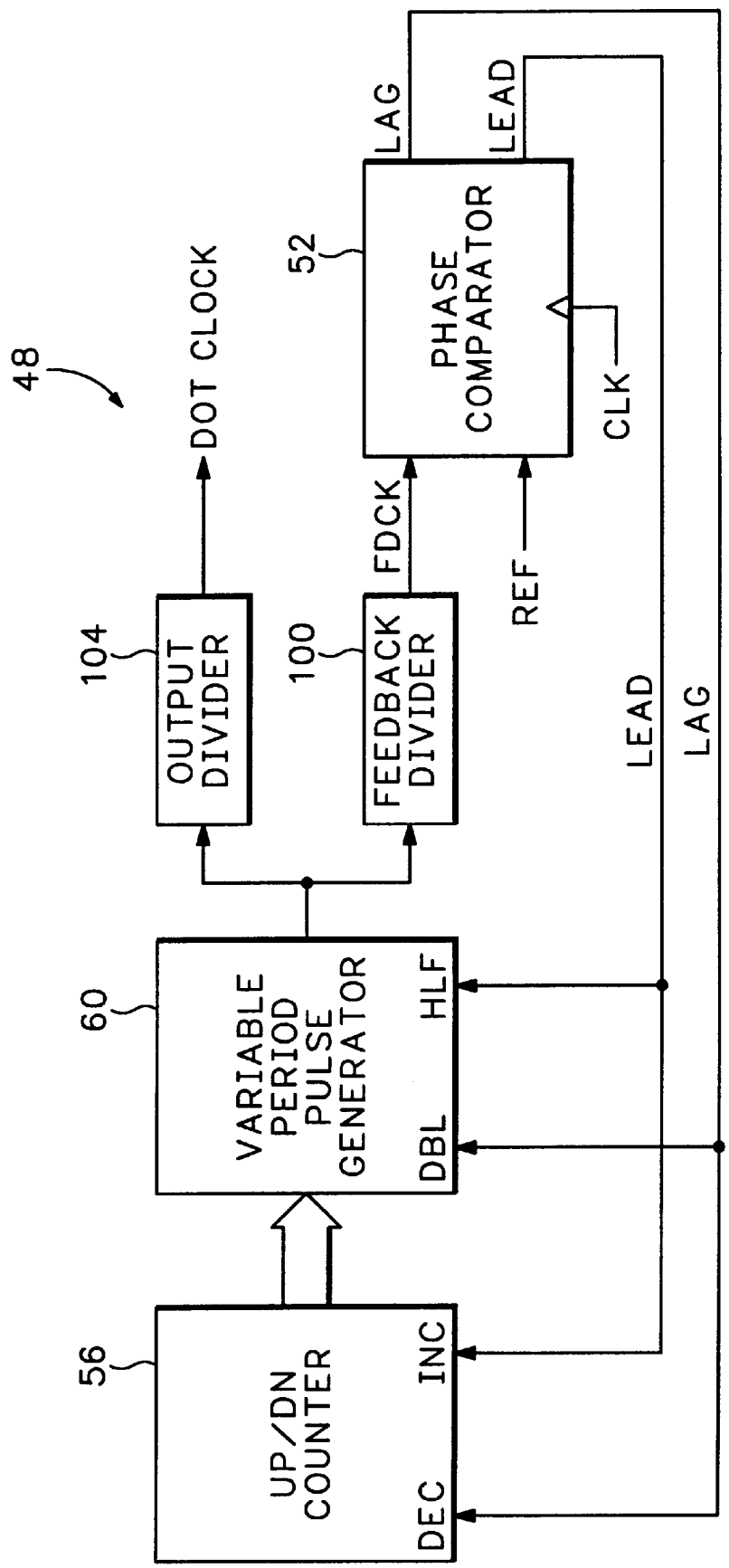
FIG. 2 is a block diagram of a digital phase locked loop circuit used to control operation of the print head.
Figure 3:
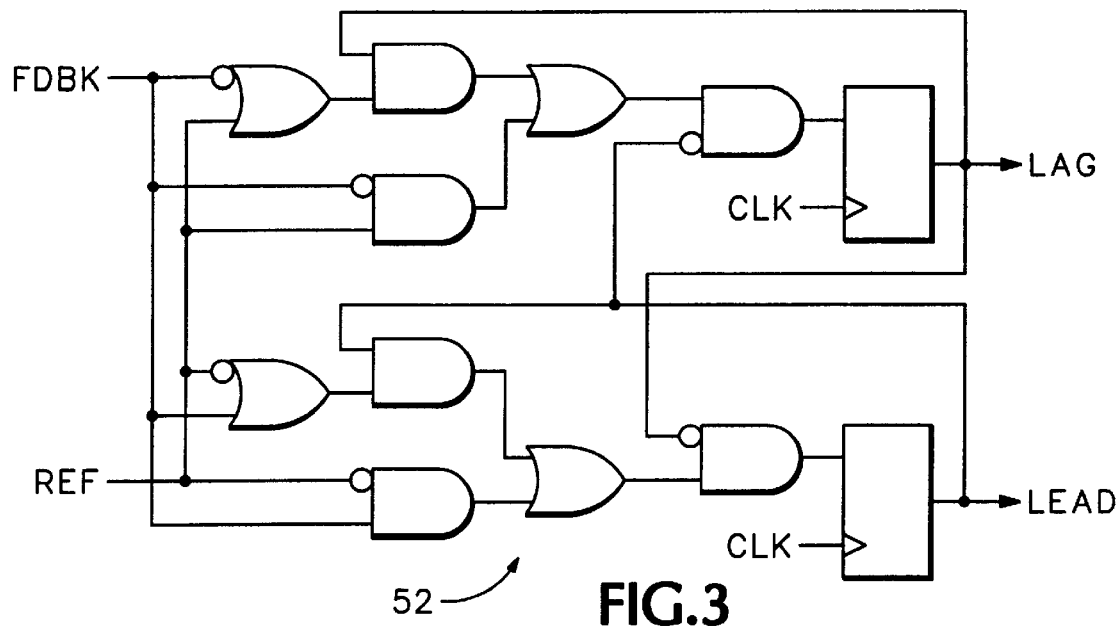
FIG. 3 is a more detailed block diagram of a first component of the digital phase locked loop circuit.

The phase locked loop 48 is a digital phase locked loop. Referring to FIGS. 2 and 3, the digital phase locked loop 48 includes a phase comparator 52 which receives the encoder signal as its reference signal and also receives a feedback signal and generates a counter control signal (lag, lead)

having a lag component and a lead component. The counter control signal is updated in response to a clock signal CLK at a much high frequency than the encoder signal. In a practical implementation, the frequency of the encoder signal is about 6.4 kHz and the frequency of the clock signal CLK is 32 MHZ.

The idle state of the counter control signal is (0, 0). If the counter control signal is initially in the idle state (0, 0) and the feedback signal changes to logic 1 while the reference signal is logic zero, the lead bit is set and the counter control signal accordingly changes to (0, 1). When the reference signal changes to logic 1, the lead bit is cleared and the counter control signal changes back to (0, 0). Similarly, if the counter control signal is in the idle state (0, 0) and the reference signal changes to logic 1 while the feedback signal is logic zero, the lag bit is set and the counter control signal changes to (1, 0); and it changes back to (0, 0) when the feedback signal changes to logic 1. If both the feedback and reference signals change to logic 1 simultaneously, the state of the counter control signal remains unchanged. It will therefore be seen that the state of the counter control signal indicates whether the feedback signal is leading or lagging the reference signal and that the amount of phase lead or lag is indicated by the length of time for which the lead or lag bit is set. A suitable phase comparator composed of combinational and sequential logic elements is shown in FIG. 3 and its mode of operation can be readily determined from the illustrated connections of the logic elements.

The lead and lag components of the counter control signal are applied to increment and decrement inputs respectively of an up/down counter 56. The up/down counter serves the function of the integrator in the conventional analog phase locked loop. The count value N1 output by the counter is decremented while the counter control signal is (1, 0), whereas the count value is incremented while the counter control signal is (0, 1). The amount by which the count value Ni is decremented or incremented depends on the time for which the counter control signal is in the state (1, 0) or (0, 1). In the idle state, the count value N1 remains constant. The count value N1 always represents a positive number and does not wrap around at either end of its range. It will therefore be seen that the up/down counter integrates the phase difference between the feedback and reference signals.

The count value N1 is applied to a period control input of a variable period pulse generator 60, which serves the function of the voltage controlled oscillator (VCO) in an analog phase locked loop.

Figure 4:
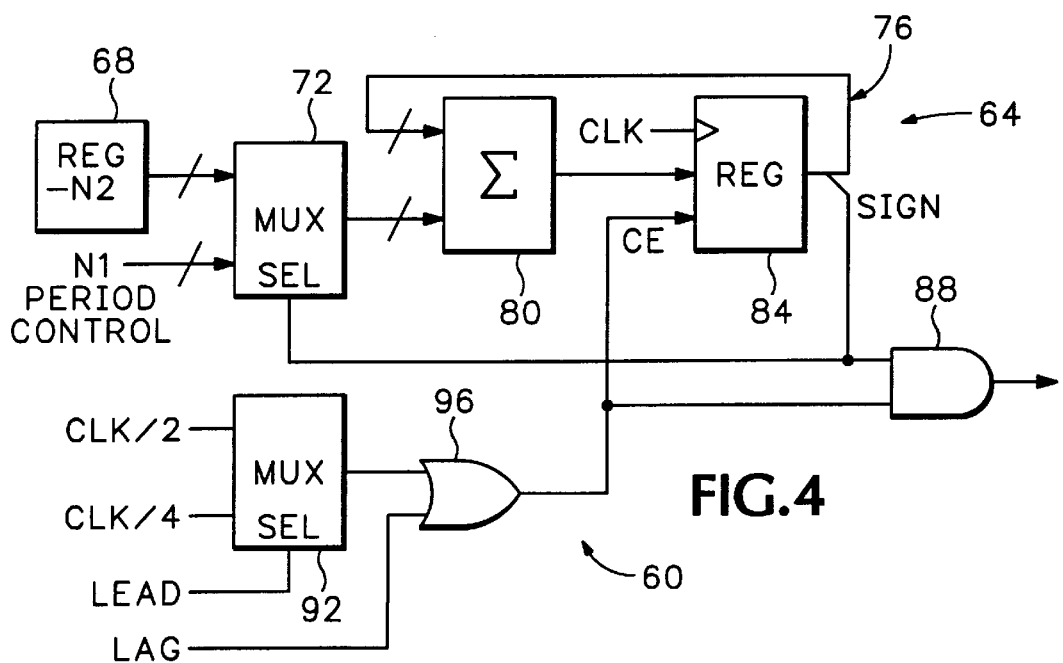
FIG. 4 is a more detailed block diagram of a second component of the digital phase locked loop circuit.

Referring to FIG. 4, the variable period pulse generator 60 includes a digital differential analyzer (DDA) 64. The digital differential analyzer 64 includes a register 68 which outputs a constant -N2 (where N2 is positive) and a multiplexer 72 which selects either the output of the register 68 or the output of the up/down counter 56 depending on the value of the DDA output signal. The value selected by the multiplexer 72 is supplied to an accumulation loop 76 comprising an adder 80 which adds the output value selected by the multiplexer 72 to the value stored in a register 84 and loads the sum into the register 84 in response to the clock signal CLK, provided that the clock signal is enabled. The sign bit of the output of the register 84 constitutes the DDA output signal and is supplied to the select input of the multiplexer 72, so that if the value stored in the register 84 is positive, the multiplexer 72 selects -N2 and the value stored in the register 84 is accordingly decreased, whereas if the sign bit represents a negative number, the multiplexer 72 selects N1 and the value stored in the register is increased.

If the clock enable input CE of the register 84 were continuously at logic 1, the DDA output signal would be a periodic signal in which the period of any cycle is an integer number of cycles of the clock signal CLK and the value of the integer number is either the integer part of ((N 1 +N2)/N2) or the integer part of ((N1 +N2)/N2) +1; and the average period of the DDA output signal over (N 1 +N2) cycles is equal to (N 1 +N2)/N2 cycles of the clock signal CLK.

The DDA output signal could be divided by an appropriate divisor and supplied to the feedback input of the phase comparator 52 to complete the phase locked loop, but the phase locked loop would not be stable in response to changes in the frequency of the reference signal.

In the conventional analog phase locked loop, a technique known as lead compensation is used to correct for frequency errors. Using lead compensation, the control signal applied to the VCO includes not only a contribution from the integral of the phase difference signal but also a contribution directly proportional to the phase difference signal. The latter component tends to increase the frequency of the VCO if the feedback signal lags the reference signal and to decrease the frequency of the VCO if the feedback signal leads the reference signal, thereby achieving rapid correction of phase errors.

In order to accomplish lead compensation in the digital phase locked loop 48, the variable period pulse generator also includes an AND gate 88 which receives the DDA output signal at one input and a qualification signal at its other input and provides the qualified DDA output signal as the output of the variable period pulse generator. The qualification signal is provided by a qualification circuit which includes a multiplexer 92 which selects either a 16 MHZ signal CLK/2 or an 8 MHZ signal CLK/4 depending on whether the lead component of the counter control signal is logic zero or logic 1 and an OR gate 96 which receives the signal selected by the multiplexer 92 and the lag component of the counter control signal. The output of the OR gate 96 is the qualification signal, which is supplied to the AND gate 88 and also serves as the clock enable signal CE for the register 84.

In the idle state, in which the counter control signal is (0, 0), the multiplexer 92 selects the 16 MHZ signal CLK/2. The multiplexer 92 and the OR gate 96 supply the 16 MHZ signal to the clock enable input of the register 84 and the AND gate 88. The action of the clock enable signal disables the accumulation loop during alternate cycles of the 32 MHZ clock signal CLK. Accordingly, in the idle state the accumulation loop operates at 16 MHZ.

In the state (1, 0), the clock enable signal is continuously at logic 1 and accordingly the accumulation loop operates at 32 MHZ. The effect is to advance the phase of the feedback signal, whereas in the state (0, 1), the multiplexer 92 selects the 8 MHZ signal CLK/4 and the accumulation loop operates at 8 MHZ and retards the phase of the feedback signal.

The effect of doubling or halving the speed of operation of the accumulation loop on the operation of the phase locked loop is compensated by virtue of the fact that the down count of the up/down counter occurs at twice the frequency of the up count. Thus, if the feedback signal leads the reference signal by time AT, the accumulation loop operates at 8 MHZ and only half of the pulses of the DDA output signal are detected. The up/down counter counts up at 16 MHZ, increasing the period of the DDA signal, and decreasing its frequency, at a rate proportional to 16 MHZ. If, on the other hand, the feedback signal lags the reference signal by time AT, the up/down counter counts down at 32 MHZ, decreasing the period of the DDA output signal and increasing its frequency at twice the rate.

The output signal of the variable period pulse generator is supplied to a feedback divider 100 and an output divider 104. The output signal of the feedback divider 100 is supplied to the phase comparator as the feedback signal and the output signal of the output divider 104 is supplied to the print head controller as the dot clock signal. The feedback divider and the output divider are each implemented as counters and are programmed to divide by integers M1 and M2 respectively. Thus, the feedback divider counts down from the value (M1 - 1) and emits a pulse when the count reaches zero, and then resets back to (M1 - 1). Correspondingly, the output divider counts down from the value (M2 - 1) and emits a dot clock when the count reaches zero, and then resets back to (M2 - 1). In the event that the Y encoder pulses are received at a frequency of 150 cycles per inch and it is desired that there be exactly 16 pixels between the closest ink jet arrays, the dot clock signal must have a frequency equal to the frequency of the Y encoder signal multiplied by 32/11. This can be accomplished by setting M1 equal to X*32 and M2 equal to X*11, where X is an integer, for example eight. The dot clock signal provided by the output divider then has a frequency of 436.3636 cycles per inch, The illustrated arrangement allows programming of the output divider and the feedback divider to provide other vertical resolutions than 436.3636 dpi. In general, to provide an integer number M pixels between two arrays that are spaced at 11/300 inch when the encoder pulses are at a frequency of 150 inch$^{-1}$, the dot clock signal has a frequency 2*M/11 the encoder signal frequency and this is implemented by a feedback divider which divides by 2*M*X and the output divider divides by 11 *X.

The dot clock signal provided by the digital phase locked loop circuit is supplied to the print head controller, which uses the dot clock signal to control the timing of the firing of the ink jets based on the image file provided by the image processor.

Figure 5:
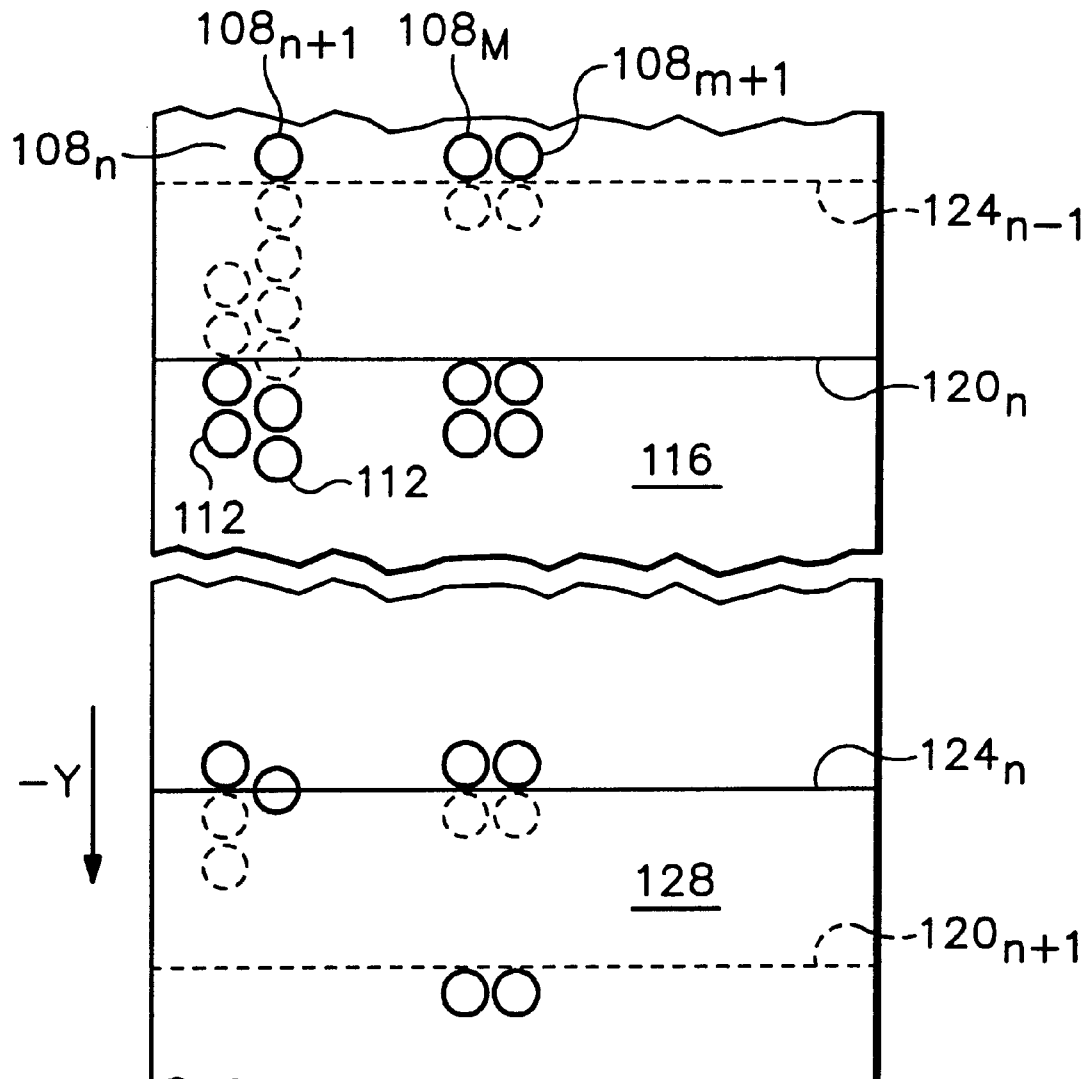
FIG. 5 is a view of the surface of the transfer drum of the ink jet printer shown in FIG. 1, developed into a plane to illustrate placement of ink dots on the surface of the transfer drum.

FIG. 5 illustrates schematically the surface of the transfer drum passing under the print head, where the different columns 108 contain pixels 112 addressed on successive revolutions of the transfer drum. In the direction of scanning by the print head, indicated by the arrow -Y, the image area 116 is defined between the line $120_n$ and the line $124_n$ and a dead band 128, on which no image is deposited, is defined between the line $124_n$ and the line $120_{n+1}$, where the subscript indicates two successive revolutions. If the dot clock signal addresses pixels at 436.3636 inch$_{-1}$ and the transfer drum has a circumference of 12.5 inches, there are 5454.5454 pixels per revolution. Therefore, if the dot clock signal during the (n +1)th revolution of the drum is in phase with the dot clock signal during the nth revolution, the pixels addressed during the (n +1)th revolution will be offset from the pixels addressed during the nth revolution by about one half the distance between two vertically adjacent pixels, as shown by the columns $108_n$ and $108_{n+1}$. This displacement can cause objectionable visual effects. In order to keep the dot clock phase aligned relative to rotation of the drum, the output divider 104 is reset during the dead band. At the end of the dead band, the output divider is taken out of reset in response to the start signal and resumes counting. Since the start signal occurs at precisely the same drum position on each revolution, the dot clock signal starts at the same phase on each drum revolution and the pixels are aligned, as shown by the columns $108_m$ and $108^{m+1}$.

Figure 6:
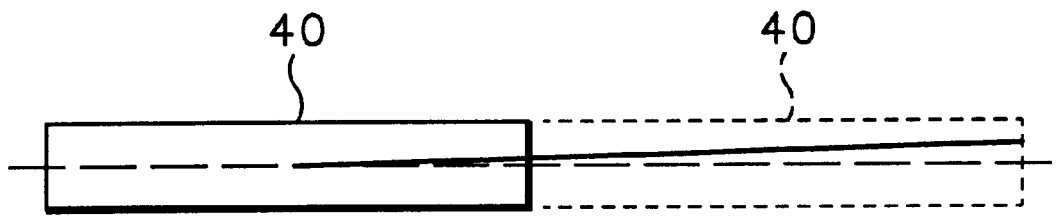
FIG. 6 is a partial schematic view of a second printer in accordance with the present the invention.

In the embodiment described with reference to FIGS. 1–4, the array print head spans the full width of the transfer drum and is moved in the X direction only in steps of one pixel after each revolution of the drum. Referring to FIG. 6, in a second embodiment of the invention, the print head 40 spans only part of the width of the transfer drum and a first part of the image is deposited on the drum while the print head 40 is in a first range of positions lengthwise of the drum, shown in solid lines, and the print head is then displaced lengthwise of the drum to a second range of positions, shown in dashed lines, and a second part of the image is deposited on the drum. In each of the first and second ranges of positions, the print head is moved in the X direction in steps of one pixel after each revolution of the drum until the respective part of the image has been deposited. For a print head of a given size in the axial direction of the drum, this technique allows a larger image to be deposited on the drum. However, if the axis along which the print head was displaced from the first range of positions to the second range of positions were not aligned precisely parallel to the axis of the print drum, as shown in FIG. 6, the second part of the image could be offset in the Y direction relative to the first part, which might be objectionable.

It is possible to compensate for this arti fact by selecting the dead band reset value of the output divider 104. In this case, while depositing the second part of the image the output divider is loaded at the end of the deadband with a value that depends on the offset of the print head in the Y direction between the first and second positions, so that the first dot clock will be properly aligned relative to the end of the dead band. After the first dot clock, the output divider 104 is loaded with the value (M2 - 1) (87 in the case of the example).

It will be appreciated that the invention is not restricted to the particular embodiment that has been described, and that variations may be made therein without departing from the scope of the invention as defined in the appended claims and equivalents thereof For example, although the invention has been described with reference to a printer in which the print head is advanced one pixel at a time in the X direction, the invention is also applicable to a printer in which the print head shuttles in the X direction during printing. In this case, the phase locked loop may be used to generate a dot clock signal in response to an encoder signal generated by a linear X-axis position encoder. The technique described with reference to FIG. 5 is then particularly useful to ensure that the dot clock signal starts at the same phase on each pass of the print head over the image receiving surface. In the case in which the print head shuttles during printing, the invention is not restricted to the image receiving surface being cylindrical, since the problem of generating the dot clock signal in response to the X-axis position encoder signal is also applicable to the case in which the image receiving surface is a flat surface of a platen. Further, although the invention has been described with reference to an image transfer printer, in which the image is deposited on the drum and is transferred from the drum to the print medium, it is also applicable to a printer of the kind in which the image is formed directly on the print medium.

What is claimed:

1. A printer including a print support member, a print head for ejecting drops of ink toward the print support member as the print support member and the print head undergo relative movement, and a control mechanism for controlling operation of the print head as a function of relative movement of the print head and print support member, said control mechanism including:

a position encoder for generating an encoder signal at a frequency dependent on relative movement of the print head and print support member, and a digital phase locked loop circuit which receives the encoder signal and generates a dot clock signal at a frequency equal to the frequency of the encoder signal multiplied by a rational number.

2. A printer according to claim 1, wherein the digital phase locked loop circuit comprises:

a phase comparator for receiving the encoder signal and a feedback signal and generating a phase difference signal having at least first and second discrete states, an integrator which outputs a digital signal representative of the integral with respect to time of the phase difference signal, a pulse generator responsive to said digital signal for generating a pulse output signal having a period dependent on said integral, and an output circuit for receiving the pulse output signal of the pulse generator and providing a first output signal and a second output signal, wherein the first output signal is the feedback signal and the second output signal is the dot clock signal.

3. A printer according to claim 2, wherein the integrator is an up/down counter for incrementing a count value in the event the phase difference signal has the first state and decrementing the count value in the event the phase difference signal has the second state and wherein the digital signal output by the integrator is a count value signal representative of the count value.

4. A printer according to claim 3, wherein the phase difference signal has a third state and the up/down counter neither increments nor decrements the count value when the phase difference signal is in the third state.

5. A printer according to claim 4, wherein the pulse generator is responsive to the phase difference signal being in the first, second or third state to generate the pulse output signal at a first, second or third frequency, and wherein the third frequency is intermediate the first and second frequencies.

6. A printer according to claim 3, wherein the up/down counter is responsive to the phase difference signal being in the first state to increment the count value at a first rate and is responsive to the phase difference signal being in the second state to decrement the count value at a second rate.

7. A printer according to claim 2, wherein the phase difference signal has the first state while the feedback signal leads the encoder signal and has the second state while the feedback signal lags the encoder signal and the integrator is an up/down counter for incrementing a count value in the event the phase difference signal is in one of the first and second states and decrementing the count value in the event the phase difference signal is in the other of the first and second states and wherein the digital signal output by the integrator is a count value signal representative of the count value.

8. A printer according to claim 2, wherein the pulse generator is responsive to the phase difference signal being in the first or second state to generate the pulse output signal at a first or second frequency.

9. A printer according to claim 2, wherein the print support member and the print head undergo relative movement in accordance with a cyclical pattern and the output circuit includes a frequency dividing counter for dividing the frequency of the pulse output signal by a selected constant to provide the second output signal, and wherein the frequency dividing counter is resettable after each cycle of relative movement to start the second output signal at a predetermined phase at the start of the next cycle of relative movement.

10. An ink jet printer including:

a print support member (12) and a print head (40) for ejecting ink drops toward the print support member as the print head and the print support member undergo relative movement in accordance with a pattern composed of scan lines parallel to a first axis and spaced apart along a second axis, wherein the print head is positionable in a first range of relative positions along the second axis for ejecting ink drops toward a first segment of the print support member and is displaceable along the second axis from the first range of relative positions to a second range of relative positions for ejecting ink drops toward a second segment of the print support member, a position encoder (20) for generating an encoder pulse signal dependent on relative movement of the print head and the print support member along said first axis, and a digital phase locked loop circuit (48) which comprises:

a phase comparator (52) for receiving the encoder pulse signal and a feedback signal and generating a phase difference signal having at least first and second states, an integrator (56) which outputs a digital signal representative of the integral with respect to time of the phase difference signal, a pulse generator (60) responsive to said digital signal for generating a pulse output signal having a period dependent on said digital signal representation, and an output circuit (100, 104) for receiving the pulse output signal of the pulse generator and providing a first output signal and a second output signal, wherein the first output signal is the feedback signal and the second output signal is the dot clock signal, and wherein the output circuit includes a frequency dividing counter (104) for dividing the frequency of the pulse output signal by a selected constant to generate the second output signal, the frequency dividing counter being resettable to a selected start value after relative displacement of the print head from the first range of relative positions to the second range of relative positions, whereby phase displacement between the output of the pulse generator and the output signal of the output divider is adjustable to compensate for change in position of the print head along the first axis on relative displacement of the print head from the first range of positions to the second range of positions.

11. A phase locked loop circuit comprising:

a phase comparator for receiving a reference pulse signal and a feedback signal and generating a phase difference signal having at least first and second states, an up/down counter for incrementing a count value in the event the phase difference signal has the first state and decrementing the count value in the event the phase difference signal has the second state and outputting a count value signal representative of the count value, and a variable period pulse generator responsive to the count value signal for generating a pulse output signal having a period dependent on said count value, the pulse ID generator including a digital differential analyzer which provides an output signal at a frequency depending on a relationship between the count value and a constant, and wherein the output of the pulse generator is operatively coupled to the feedback input of the phase comparator.

12. A phase locked loop circuit comprising:

a phase comparator (52) for receiving a reference pulse signal and a feedback signal and generating a phase difference signal having at least first and second states, a counter (56) for incrementing a count value in the event the phase difference signal has the first state and decrementing the count value in the event the phase difference signal has the second state and outputting a count value signal representative of the count value, a variable period pulse generator (60) responsive to the count value signal for generating an output pulse signal having a period dependent on said count value, the output of the pulse generator being operatively coupled to the feedback input of the phase comparator, and an output divider (104) for receiving the pulse output signal of the pulse generator and providing an output signal, the output divider being resettable whereby the phase displacement between the output of the pulse generator and the output signal of the output divider is adjustable.

* * * * *